United States Patent
Wesselkamper et al.

(10) Patent No.: US 10,978,167 B1
(45) Date of Patent: Apr. 13, 2021

(54) EFUSE BANK AND ASSOCIATED ANCHOR BITS

(71) Applicant: Xilinx, Inc., San Jose, CA (US)

(72) Inventors: James D. Wesselkamper, Albuquerque, NM (US); Edward S. Peterson, Queen Creek, AZ (US); Jason J. Moore, Albuquerque, NM (US); Steven E. McNeil, Rio Rancho, NM (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/806,546

(22) Filed: Mar. 2, 2020

(51) Int. Cl.
*G11C 17/00* (2006.01)
*G11C 17/16* (2006.01)
*G11C 17/18* (2006.01)

(52) U.S. Cl.
CPC .............. *G11C 17/16* (2013.01); *G11C 17/18* (2013.01)

(58) Field of Classification Search
CPC ................................ G11C 17/16; G11C 17/18
USPC ............................................................ 365/96
See application file for complete search history.

(56) References Cited

U.S. PATENT DOCUMENTS

| 7,200,064 B1 * | 4/2007 | Boerstler | G11C 17/16 365/189.16 |
| 9,230,112 B1 * | 1/2016 | Peterson | G06F 9/4406 |

OTHER PUBLICATIONS

Timmers et al., "Hardening Secure Boot on Embedded Devices for Hostile Environments.", Riscure. Available: https://www.riscure.com/uploads/2019/06/Riscure_Hardening_Secure_Boot_Hostile_Environments.pdf. [Accessed Jun. 2019].
Xlinx, Inc. U.S. Appl. No. 16/806,475, filed Mar. 2, 2020.

\* cited by examiner

*Primary Examiner* — Huan Hoang
(74) *Attorney, Agent, or Firm* — Crawford Maunu PLLC

(57) ABSTRACT

A disclosed circuit arrangement includes a bank of efuse cells, first and second sense amplifiers coupled to input signals representing constant logic-1 and logic-0 values, respectively, a storage circuit, an efuse control circuit, and an efuse security circuit. The efuse control circuit inputs signals from the bank of efuse cells and signals that are output from the first and second sense amplifiers, and stores data representative of values of the signals in the storage circuit. The efuse security reads the data from the storage circuit and generates an alert signal having a state that indicates a security violation in response to data representative of the value of the signal from the first sense amplifier indicating a logic-0 value or data representative of the value of the signal from the second sense amplifier indicating a logic-1 value.

20 Claims, 5 Drawing Sheets

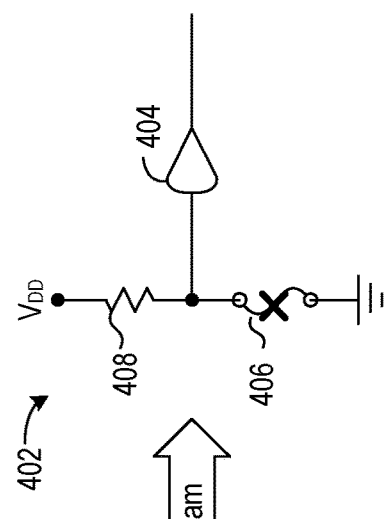
FIG. 4  Default sense output logic-0
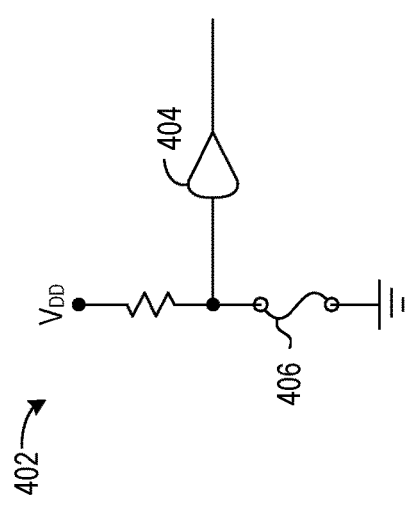
FIG. 5  Programmed sense output logic-1
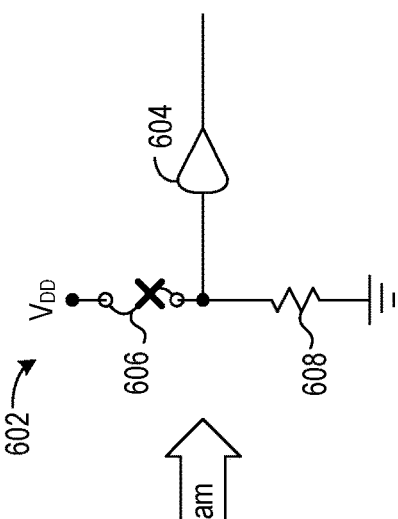
FIG. 6  Default sense output logic-1
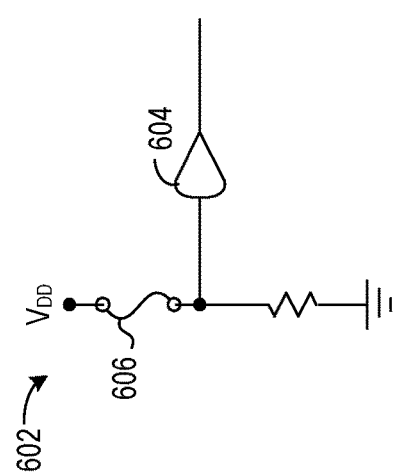
FIG. 7  Programmed sense output logic-0

EFUSE BANK AND ASSOCIATED ANCHOR BITS

TECHNICAL FIELD

The disclosure generally relates to protecting against attacks on an electronic system.

BACKGROUND

Electronic systems often employ one-time programmable (OTP) circuits to establish static configuration data for customizing certain attributes of the system. One such customization can control security features of the system. For example, OTP circuits can be used to enable security functions for booting the electronic system and provide keys used for encryption and/or decryption.

Researchers have found that the signals sensed from OTP circuits can be intentionally disturbed by way of electromagnetic fault injection (EMFI). Unauthorized parties may seek to bypass system security through an EMFI attack on the OTP circuits.

SUMMARY

A disclosed circuit arrangement includes a bank of efuse cells, first and second sense amplifiers, a storage circuit, an efuse control circuit, and an efuse security circuit. The first sense amplifier has an input coupled to a first signal line that is configured to carry a first signal representing a constant logic-1 value. The second sense amplifier has an input coupled to a second signal line that is configured to carry a second signal representing a constant logic-0 value. The efuse control circuit is coupled to the storage circuit, the bank of efuse cells, and to the first and second sense amplifiers. The efuse control circuit is configured to input signals from the bank of efuse cells and signals that are output from the first and second sense amplifiers, and to store data representative of values of the signals from the bank of efuse cells and values of the signals from the first and second sense amplifiers in the storage circuit. The efuse security circuit is coupled to the storage circuit and is configured to read the data from the storage circuit and generate an alert signal having a state that indicates a security violation in response to data representative of the value of the signal from the first sense amplifier indicating a logic-0 value or data representative of the value of the signal from the second sense amplifier indicating a logic-1 value.

A disclosed method includes providing a first sense signal by a first sense amplifier in response to an input of the first sense amplifier that is coupled to a signal line configured to carry a signal representing a constant logic-1 value. The method includes providing a second sense signal by a second sense amplifier in response to an input of the second sense amplifier that is coupled to a signal line configured to carry a signal representing a constant logic-0 value. An efuse control circuit inputs signals from a bank of efuse cells, the first sense signal, and the second sense signal. The efuse control circuit stores data representative of values of the signals from the bank of efuse cells and values of the first sense signal and second sense signal in a storage circuit. The method includes an efuse security circuit reading the data from the storage circuit and generating an alert signal having a state that indicates a security violation in response to data representative of the value of the first sense signal indicating a logic-0 value or data representative of the value of the second sense signal indicating a logic-1 value.

Other features will be recognized from consideration of the Detailed Description and Claims, which follow.

BRIEF DESCRIPTION OF THE DRAWINGS

Various aspects and features of the circuits and methods will become apparent upon review of the following detailed description and upon reference to the drawings in which:

FIG. 4 shows an example of an efuse cell that outputs a signal having a logic-0 value in a default configuration;

FIG. 5 shows the efuse cell of FIG. 4 in a programmed state;

FIG. 6 shows an example of an efuse cell that outputs a signal having a logic-1 value in a default configuration;

FIG. 7 shows the efuse cell of FIG. 6 in a programmed state; and

DETAILED DESCRIPTION

Figure 1:
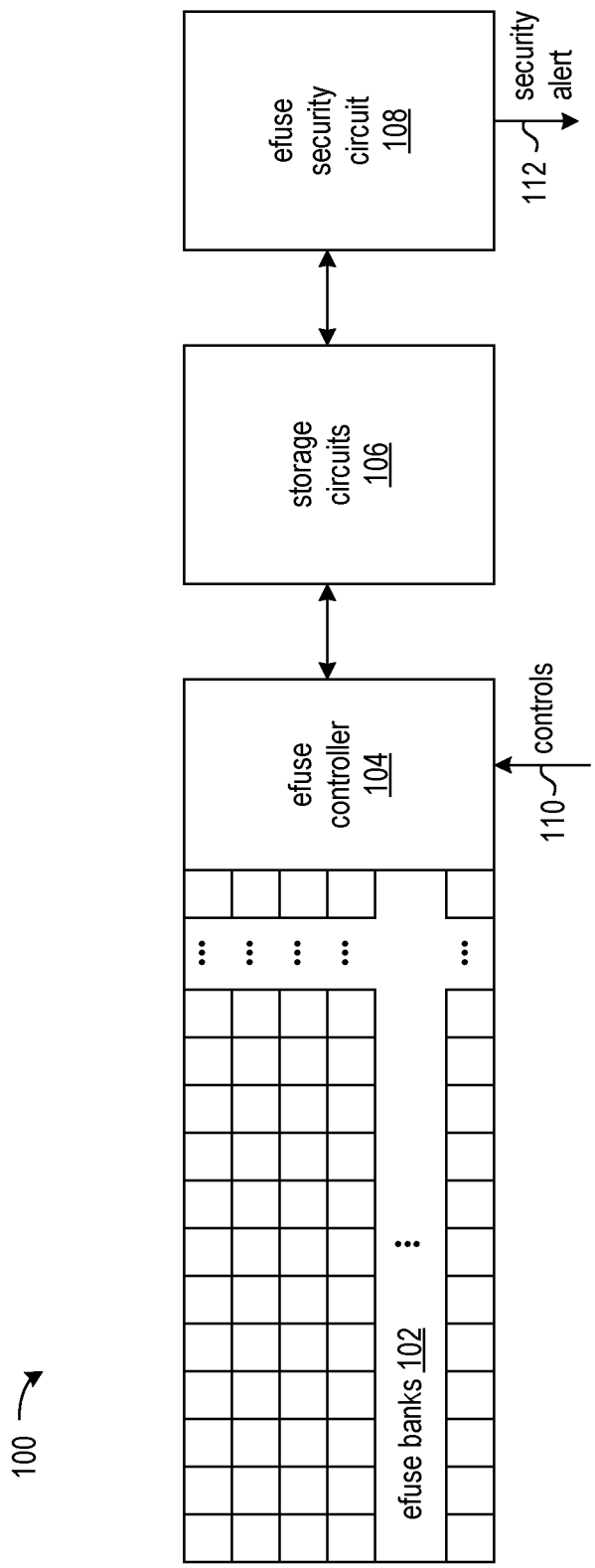
FIG. 1 shows a circuit arrangement that can detect attacks on OTP circuits of an electronic system.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

Some electronic systems have efuses as OTP circuits for controlling security features, such as authentication and decryption of data used to configure the system for secure booting. The data represented by the efuses can enable a security mode and/or encode one or more cipher keys. The efuses can be arranged as one or more banks of multiple efuses, with each bank providing a multi-bit word of data. The banks of efuses can be implemented on an integrated circuit die as a monolithic group of circuit elements. An efuse controller circuit can be coupled to the banks of efuses for one-time programming of the efuses and reading data from the programmed efuses.

Prior to processing data programmed in efuses, some systems will store the data read from the efuses in data storage circuits such as a set of registers or a RAM. The efuse data may be read and stored in storage circuits because the data may need to be accessed multiple times and the efuses may be reliable for a limited number of reads. In one application the system will read data from the efuses once per power cycle, and subsequent accesses to that data is made to the data storage circuits.

An EMFI attack on the system focuses on particular areas of an IC die or package and can corrupt the data as it is read from the efuses. The EMFI attack can result in all logic-0 values or all logic-1 values instead of the logic values actually programmed into the efuses. An EMFI attack can cause the system to bypass configured security measures and permit loading of configuration data or program code that is signed.

The disclosed circuits and methods protect against EMFI attacks on OTP circuits, such as efuses. The term "efuse cell" may be used instead of the shortened "efuse" to permit reference to the elements that are typically considered to be part of the efuse. For example, an efuse cell includes, among other circuit elements, a sense amplifier and an efuse circuit that can be "blown" in programming the efuse cell.

The disclosed approaches implement at least two anchor bits that are associated with a bank of efuse cells. An attack can be detected in response to the states of the two anchor bits being the same logic value. The anchor bits can be implemented by a first sense amplifier having an input coupled to a signal line carries a signal representing a constant logic-1 value, and a second sense amplifier having an input coupled to another signal line that carries a signal representing a constant logic-0 value. An efuse control circuit reads the states of the bank of efuses and the signals from the sense amplifiers of the anchor bits and stores data indicating the logic states in a storage circuit. An efuse security circuit reads the anchor bit data from the storage circuit to determine whether or not an EMFI attack has occurred. In response to the anchor bit data indicating any value other than a logic-1 value from the first sense amplifier and a logic-0 value from the second sense amplifier, the efuse security circuit generates an alert signal having a state that indicates a security violation.

FIG. 1 shows a circuit arrangement 100 that can detect attacks on OTP circuits of an electronic system. The circuit arrangement includes multiple efuse banks 102, an efuse controller 104, storage circuits 106, and efuse security circuitry 108.

The efuse banks 102 can be arranged on an integrated circuit (IC) die as rows of efuse cells. Each row is a bank, and the number of efuse cells in a row can be equal to the size of a word in storage circuits 106, for example. The efuse cells can be programmed to enable various security features and store cipher keys used in authentication and decryption. Each efuse cell includes an efuse circuit and a sense amplifier. The efuse circuit of an efuse cell can be blown (programmed) to change the state of the signal output by the sense amplifier to a state having an opposite logic value from the state of the signal output by the sense amplifier when the efuse cell is in the default state.

The efuse controller 104 can program the efuse cells in the efuse banks 102 and can read sensed signals from the efuse cells. In response to input control signals 110, such as from a state machine or processor, the efuse controller can select banks of efuse cells and store data in the storage circuits 106 according to the states of the sensed signals from the selected efuse cells. Control signals 110 can also prompt the efuse controller to program selected ones of the efuse cells.

Data read from or to be programmed into the efuse cells can be stored in the storage circuits 106. The storage circuits can be groups of registers or a RAM, in which case the storage circuits can be accessed by a memory bus. The storage circuits can be used to effectively cache data configured in the efuse banks 102, as the efuse circuits may be reliable for only a limited number of reads. Configuration logic (not shown) can access the storage circuits for performing secure booting of the system, for example.

The efuse security circuit 108 detects whether or not data read from the efuse banks 102 into the storage circuits 106 has been compromised, such as from an EMFI attack. According to the disclosed approaches, at least two anchor bits are implemented by sense amplifiers that input signals having opposite logic values that are constant. That is, the signal sensed from a first sense amplifier has a constant logic-0 value, and the signal sensed from a second sense amplifier has a constant logic-1 value.

In response to the anchor bits being other than a logic-0 value from the first sense amplifier and a logic-1 value from the second sense amplifier, the efuse security circuit can assert the alert signal 112 to a state that indicates a security violation. The efuse security circuit can be a hardwired state machine or a processor that executes program code. The logic of the efuse security circuit can be integrated with a configuration and security unit of the electronic system.

In one approach, the first and second sense amplifiers are coupled to adjacent signal lines of a data bus that is coupled to the storage circuits. The first and second sense amplifiers can be disposed adjacent (i.e., no other sense amplifiers between the first and second) to one another and adjacent to a row of efuse cells on an IC die so that an EMFI attack would affect the anchor bit signals and could be detected. The sense amplifiers of the efuse cells in the associated row can be coupled to other signal lines of the data bus, respectively.

In addition to checking the anchor bits in the storage circuits, if the values in the storage circuit from all the efuse cells in the associated row are all logic-0, the efuse security circuit can detect that the efuse cells have been compromised and assert the alert signal 112.

The states of a bank of efuse cells can also be used by the efuse security circuit to detect when a new and unused (not yet programmed) electronic system is under an EMFI attack. The efuse cells in a row/bank can be fabricated to have alternating default states. That is, adjacent efuse cells in a row have opposite default states. The logic values indicated by the default states of a row/bank of efuse cells can be '01010101 . . . 0101' or '10101010 . . . 1010', for example. The efuse security circuit 108 can detect an attack and assert the alert signal 112 in response to the data in the storage circuits 106 indicating that the sensed signals from a row/bank of efuse cells are all logic-0 values or are all logic-1 values. The asserted alert signal can disable programming of the efuse banks 102.

Booting of the electronic system can be enabled or disabled in response to the state of the alert signal 112. For example, loading of a boot image, such as a configuration bitstream or program code, into memory circuits of the electronic system can be disabled in response to the state of the alert signal indicating a security violation. Loading of the boot image into the memory circuits can be enabled in response to the state of the alert signal not indicating a security violation. As non-limiting examples, an electronic system can be a system-on-chip (SoC), a system-in-package (SiP), a programmable logic device (PLD), a field programmable gate array (FPGA.), a microprocessor, etc.

In alternative approaches, an efuse bank can have two or more pairs of anchor bits. One pair of anchor bits can be used for detecting an EMFI attack, and depending on application objectives, one or more of the additional pairs of anchor bits can also be used for detecting an EMFI attack. In some implementations, additional pairs of anchor bits need not be used for detection of EMFI attacks and could be used for other purposes.

In a circuit arrangement in which two pairs of anchor bits are used for detecting an EMFI attack, an attack can be detected if data of either of the pairs of anchor bits in the storage circuits 106 is invalid. That is, in addition to first and second sense amplifiers for a first pair of anchor bits, another pair of sense amplifiers can include third and fourth sense amplifiers. The signal sensed from the third sense amplifier is expected to be a constant logic-0 value, and the signal sensed from the fourth sense amplifier is expected to be a constant logic-1 value. The efuse security circuit can assert the alert signal 112 to a state that indicates a security violation in response to either the anchor bit data of the first pair or the anchor bit data of the second pair being invalid. The sense amplifiers of the efuse cells in the efuse bank associated with the first and second pairs of anchor bits can be disposed on an IC die between the two pairs of sense amplifiers of the first and second pairs of anchor bits. Also, the sense amplifiers of the efuse cells in the efuse bank can be coupled to signal lines of the data bus that are disposed between the pairs of signal lines carrying sensed signals of the anchor bits.

Figure 2:
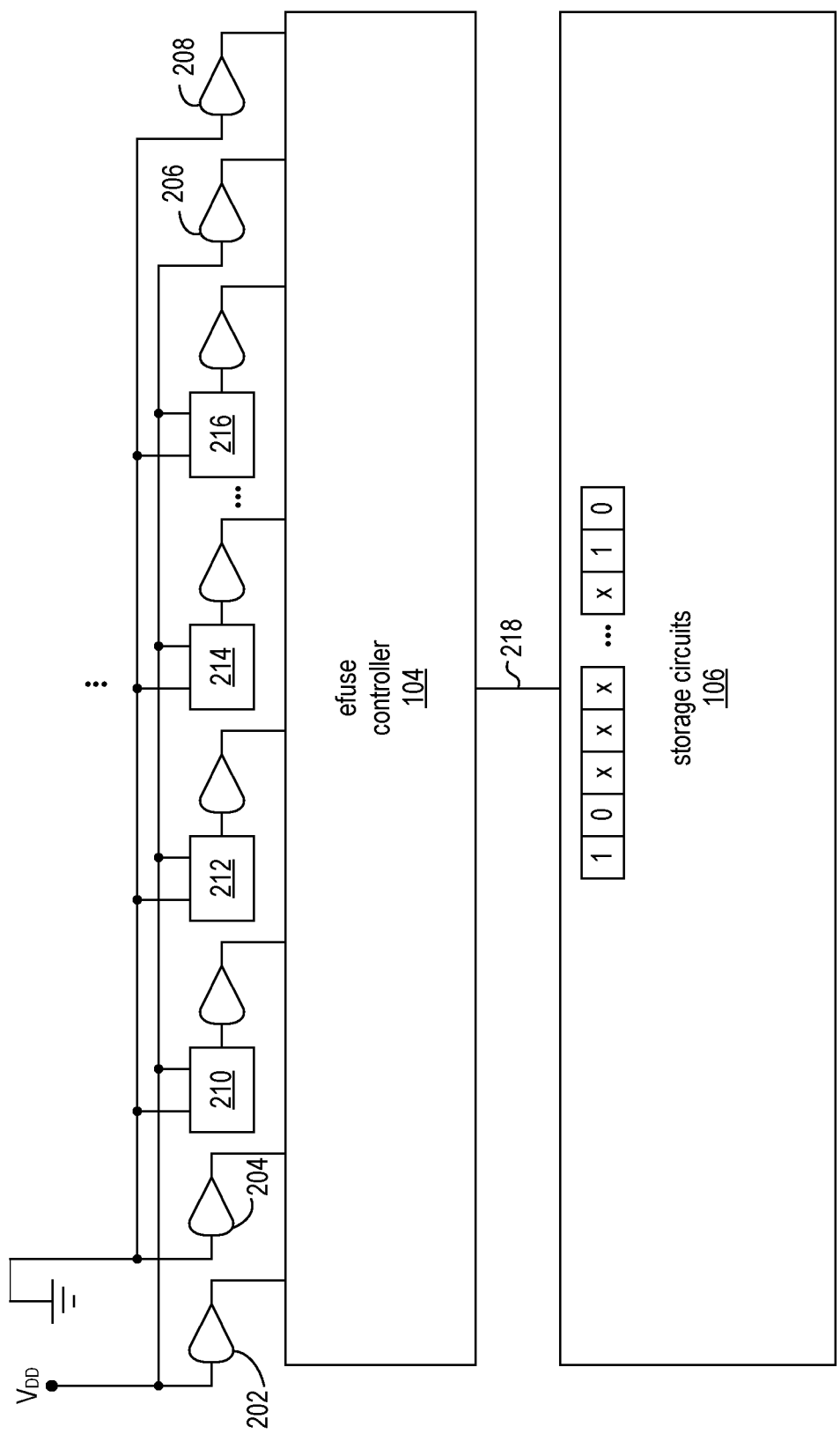
FIG. 2 shows an example of a circuit arrangement that includes a bank of one-time programmable circuits and circuitry that implements two pairs of anchor bits.

FIG. 2 shows an example of a circuit arrangement that includes a bank of one-time programmable circuits and circuitry that implements two pairs of anchor bits. Though the example circuit shows circuitry that implements two pairs of anchor bits, alternative approaches could employ only one pair of anchor bits as described above.

One pair of anchor bits is implemented by sense amplifiers 202 and 204 that are coupled to a supply voltage source and ground of an integrated circuit (IC) die, respectively. The second pair of anchor bits is implemented by sense amplifiers 206 and 208 that are coupled to the supply voltage source and ground, respectively. The sense amplifiers 202 and 204 can be disposed adjacent to one other on the IC die. Similarly, the sense amplifiers 206 and 208 can be disposed adjacent to one other. That is, no sense amplifier of the OTP circuits is disposed between the anchor bit sense amplifiers 202 and 204, and no sense amplifier of the OTP circuits is disposed between the anchor bit sense amplifiers 206 and 208.

The OTP circuits can include efuses 210, 212, 214, . . . , 216 and associated sense amplifiers. The efuses and sense amplifiers can be disposed on an IC die between the pairs of anchor bit circuits.

The efuse controller is coupled to the anchor bit sense amplifiers and to the sense amplifiers of the OTP circuits. The efuse controller can select the signals from the anchor bit sense amplifiers and from the OTP circuits to connect to signal lines of a data bus 218 for input to the storage circuits 106. The sensed signals from the two anchor bit sense amplifiers of a pair can be connected to adjacent signal lines of the data bus. For example, if a data bus has signal lines 0 . . . 15, the signal from sense amplifier 202 can be connected to signal line 0 and the signal from sense amplifier 204 can be connected to signal line 1. Likewise, the signal from sense amplifier 206 can be connected to signal line 14 and the signal from sense amplifier 208 can be connected to signal line 15. The signals from the sense amplifiers connected to the efuses 210, 212, 214, . . . , 216 can be connected to data bus lines 3, 4, 5, . . . , 13, respectively.

Figure 3:
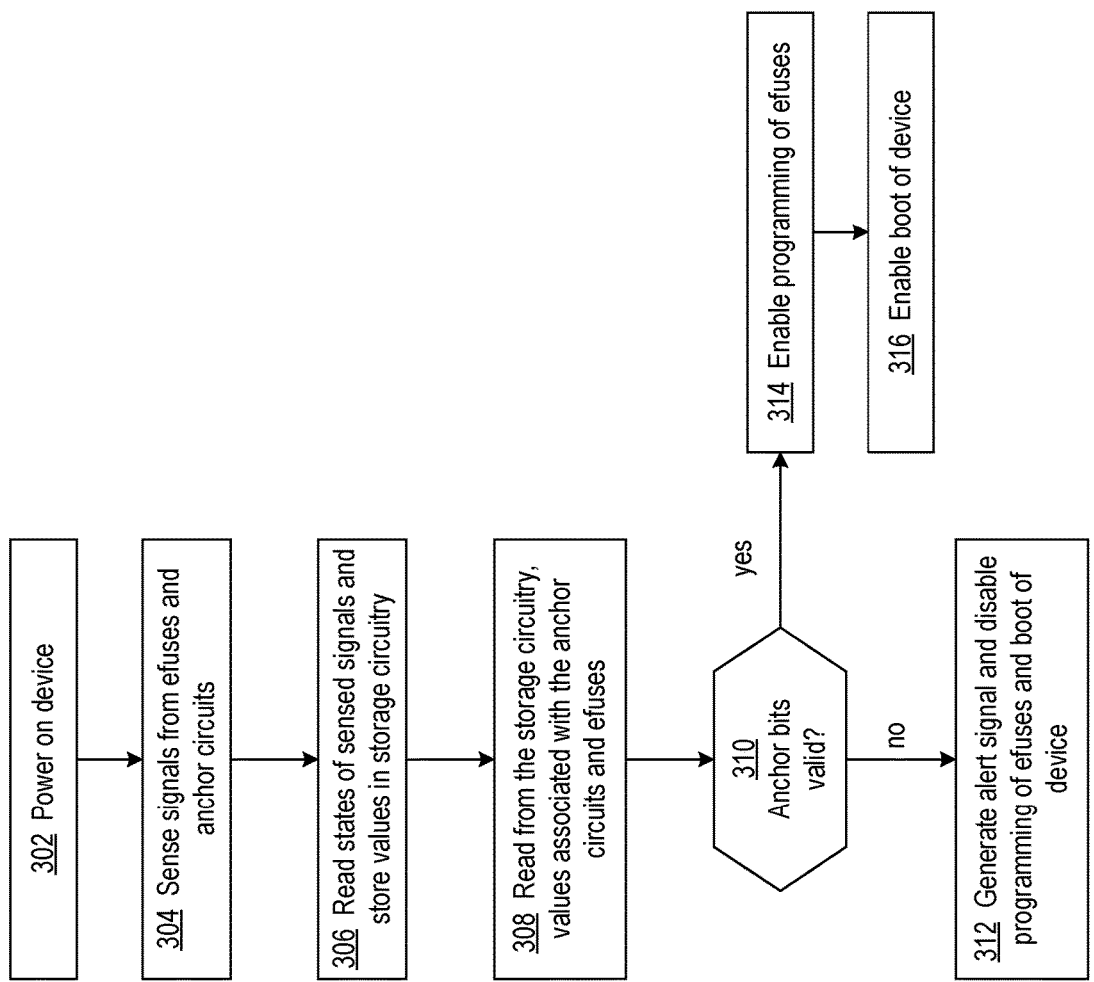
FIG. 3 shows a flowchart of an exemplary process for protecting an electronic system against EMFI attacks on OTP circuits.

FIG. 3 shows a flowchart of an exemplary process for protecting an electronic system against EMFI attacks on OTP circuits. At block 302, power is applied to the system, and at block 304 the sense amplifiers of selected pairs of anchor bits and efuse cells sense efuse signals. The anchor bits and efuse cells can be selected and sensing enabled by the efuse controller 104 (FIG. 1), for example. The efuse controller reads the states of the sense efuse signals at block 306 and stores bit values that indicate the signal states in storage circuits 106 (FIG. 1).

At block 308, the efuse security circuit 108 (FIG. 1) reads from the storage circuit data that indicate the logic states of one or more pairs of anchor bits and an associated group of adjacent efuse cells, such as a bank/row of efuse cells.

In response to the anchor bits having an invalid value, decision block 310 directs the efuse security circuit to block 312. At block 312, the efuse security circuit asserts an alert signal to indicate the efuses have been compromised. The asserted alert signal disables programming of the efuses of the system and disables booting of the system. In response to the anchor bits having a valid value, decision block 310 directs the efuse security circuit to block 314. At block 314, the efuse security circuit de-asserts the alert signal, which enables programming of the efuses and enables booting of the device at block 316. Programming of the efuses can also be enabled or disabled based on the data read from the storage circuit that indicates the sensed states of the bank of efuses.

FIGS. 4, 5, 6, and 7 show default and programmed states of efuse cells. FIGS. 4 and 6 show efuse cells having opposite default states. FIG. 5 shows the programmed state of the efuse cell from FIG. 4, and FIG. 7 shows the programmed state of the efuse cell from FIG. 6.

FIG. 4 shows an example of an efuse cell 402 that outputs a signal having a logic-0 value in a default configuration. The signal output by sense amplifier 404 indicates the logic state of the efuse cell. In the default (un-programmed state), the input of the sense amplifier is coupled to ground (of the IC die) through efuse circuit 406.

FIG. 5 shows the efuse cell 402 of FIG. 4 in a programmed state. In the programmed state, the efuse circuit 406 is blown, which disconnects the input of the sense amplifier 404 from ground, and the efuse cell outputs a signal having a logic-1 in response to the coupling of the sense amplifier to a supply voltage through resistor 408.

FIG. 6 shows an example of an efuse cell 602 that outputs a signal having a logic-1 value in a default configuration. The signal output by sense amplifier 604 indicates the logic state of the efuse cell. In the default (un-programmed state), the input of the sense amplifier is coupled to the supply voltage through efuse circuit 606.

FIG. 7 shows the efuse cell 602 of FIG. 6 in a programmed state. In the programmed state, the efuse circuit 606 is blown, which disconnects the input of the sense amplifier 604 from the supply voltage, and the efuse cell outputs a signal having a logic-0 in response to the coupling of the sense amplifier 604 to ground through resistor 608.

Figure 8:
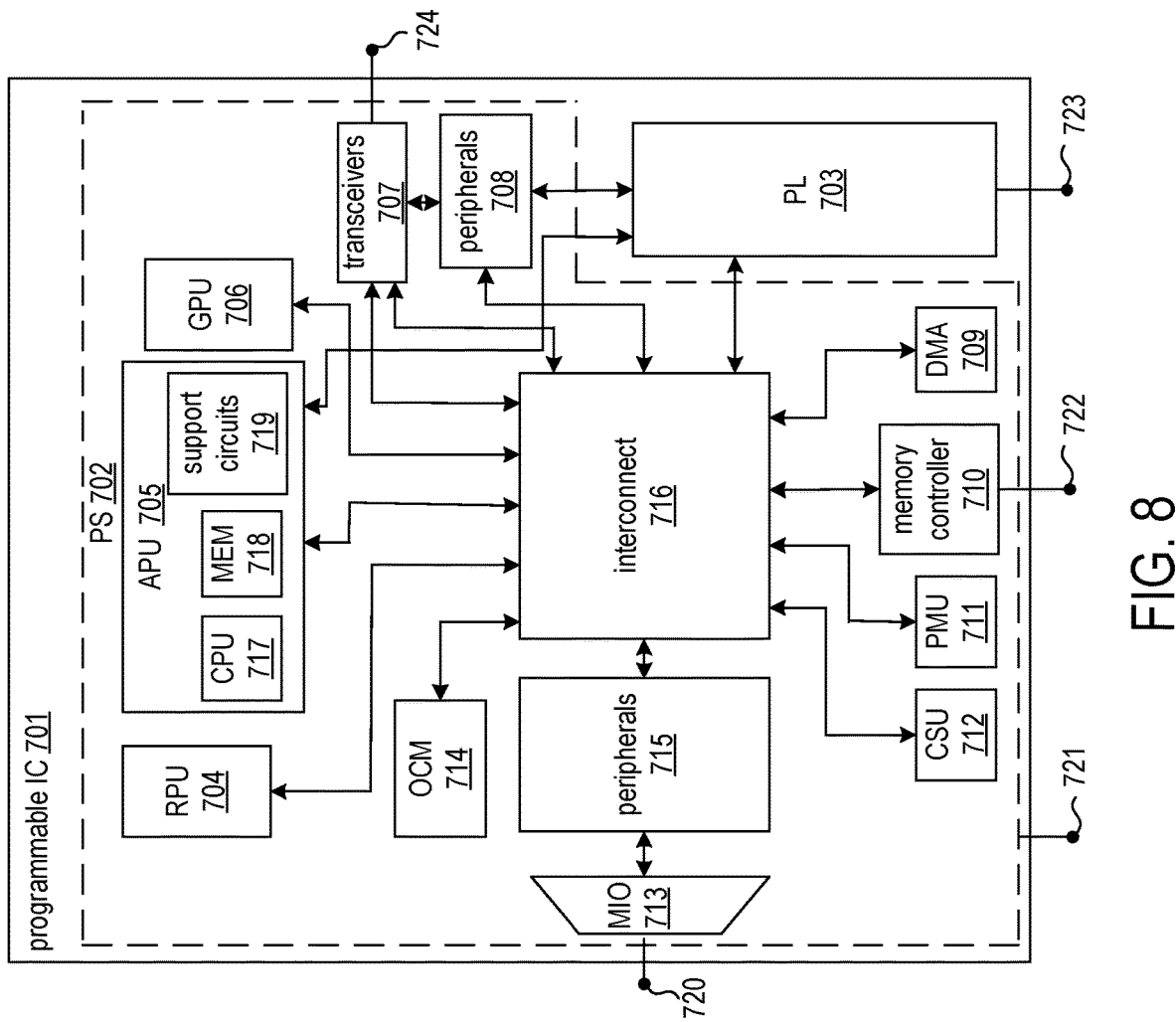
FIG. 8 is a block diagram depicting a System-on-Chip that can implement the disclosed approaches for detecting against EMFI attacks on efuses of the system.

FIG. 8 is a block diagram depicting a System-on-Chip (SoC) 701 that can implement the disclosed approaches for detecting against EMFI attacks on efuses of the system. In the example, the SoC includes the processing subsystem (PS) 702 and the programmable logic subsystem 703. The processing subsystem 702 includes various processing units, such as a real-time processing unit (RPU) 704, an application processing unit (APU) 705, a graphics processing unit (GPU) 706, a configuration and security unit (CSU) 712, and a platform management unit (PMU) 711. The efuse security circuit can be integrated with CSU 712 or be a support circuit outside the CSU. The PS 702 also includes various support circuits, such as on-chip memory (OCM) 714, transceivers 707, peripherals 708, interconnect 716, DMA circuit 709, memory controller 710, peripherals 715, and multiplexed (MIO) circuit 713. The processing units and the support circuits are interconnected by the interconnect 716. The PL subsystem 703 is also coupled to the interconnect 716. The transceivers 707 are coupled to external pins 724. The PL 703 is coupled to external pins 723. The memory controller 710 is coupled to external pins 722. The MIO 713 is coupled to external pins 720. The PS 702 is generally coupled to external pins 721. The APU 705 can include a CPU 717, memory 718, and support circuits 719. The APU 705 can include other circuitry, including L1 and L2 caches and the like. The RPU 704 can include additional circuitry, such as L1 caches and the like. The interconnect 716 can include cache-coherent interconnect or the like.

Referring to the PS 702, each of the processing units includes one or more central processing units (CPUs) and associated circuits, such as memories, interrupt controllers, direct memory access (DMA) controllers, memory management units (MMUs), floating point units (FPUs), and the like. The interconnect 716 includes various switches, busses, communication links, and the like configured to interconnect the processing units, as well as interconnect the other components in the PS 702 to the processing units.

The OCM 714 includes one or more RAM modules, which can be distributed throughout the PS 702. For example, the OCM 714 can include battery backed RAM (BBRAM), tightly coupled memory (TCM), and the like. The memory controller 710 can include a DRAM interface for accessing external DRAM. The peripherals 708, 715 can include one or more components that provide an interface to the PS 702. For example, the peripherals can include a graphics processing unit (GPU), a display interface (e.g., DisplayPort, high-definition multimedia interface (HDMI) port, etc.), universal serial bus (USB) ports, Ethernet ports, universal asynchronous transceiver (UART) ports, serial peripheral interface (SPI) ports, general purpose (GPIO) ports, serial advanced technology attachment (SATA) ports, PCIe ports, and the like. The peripherals 715 can be coupled to the MIO 713. The peripherals 708 can be coupled to the transceivers 707. The transceivers 707 can include serializer/deserializer (SERDES) circuits, MGTs, and the like.

Various logic may be implemented as circuitry to carry out one or more of the operations and activities described herein and/or shown in the figures. In these contexts, a circuit or circuitry may be referred to as "logic," "module," "engine," or "block." It should be understood that logic, modules, engines and blocks are all circuits that carry out one or more of the operations/activities. In certain implementations, a programmable circuit is one or more computer circuits programmed to execute a set (or sets) of instructions stored in a ROM or RAM and/or operate according to configuration data stored in a configuration memory.

Though aspects and features may in some cases be described in individual figures, it will be appreciated that features from one figure can be combined with features of another figure even though the combination is not explicitly shown or explicitly described as a combination.

The circuits and methods are thought to be applicable to a variety of systems for detecting EMFI attacks on OTP circuits. Other aspects and features will be apparent to those skilled in the art from consideration of the specification. The circuits and methods can be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A circuit arrangement comprising:
a bank of efuse cells;
a first sense amplifier having an input coupled to a first signal line that is configured to carry a first signal representing a constant logic-1 value;
a second sense amplifier having an input coupled to a second signal line that is configured to carry a second signal representing a constant logic-0 value;
a storage circuit;
an efuse control circuit coupled to the storage circuit, the bank of efuse cells, and to the first and second sense amplifiers, wherein the efuse control circuit is configured to input signals from the bank of efuse cells and signals that are output from the first and second sense amplifiers, and store data representative of values of the signals from the bank of efuse cells and values of the signals from the first and second sense amplifiers in the storage circuit; and
an efuse security circuit coupled to the storage circuit, wherein the efuse security circuit is configured to:
read the data from the storage circuit, and
generate an alert signal having a state that indicates a security violation in response to data representative of the value of the signal from the first sense amplifier indicating a logic-0 value or data representative of the value of the signal from the second sense amplifier indicating a logic-1 value.

2. The circuit arrangement of claim 1, wherein an output of the first sense amplifier is coupled to a first signal line of a data bus (218), an output of the second sense amplifier is coupled to a second signal line of the data bus, and the first signal line of the data bus is adjacent to the second signal line of the data bus.

3. The circuit arrangement of claim 2, wherein the bank of efuse cells have outputs coupled to respective signal lines of the data bus other than the first and second signal lines of the data bus.

4. The circuit arrangement of claim 1, further comprising:
a third sense amplifier having an input coupled to the first signal line;
a fourth sense amplifier having an input coupled to the second signal line; and
wherein:
the efuse control circuit is coupled to the third and fourth sense amplifiers and is configured to input signals that are output from the third and fourth sense amplifiers.

5. The circuit arrangement of claim 4, wherein the efuse security circuit is configured to generate the alert signal having the state that indicates a security violation in response to data representative of the value of the signal from the third sense amplifier indicating a logic-0 value or data representative of the value of the signal from the fourth sense amplifier indicating a logic-1 value.

6. The circuit arrangement of claim 5, wherein:
an output of the first sense amplifier is coupled to a first signal line of a data bus, an output of the second sense amplifier is coupled to a second signal line of the data bus, and the first signal line of the data bus is adjacent to the second signal line of the data bus; and
an output of the third sense amplifier is coupled to a third signal line of the data bus, an output of the fourth sense amplifier is coupled to a fourth signal line of the data bus, and the third signal line of the data bus is adjacent to the fourth signal line of the data bus.

7. The circuit arrangement of claim 6, wherein the bank of efuse cells have outputs coupled to respective signal lines of the data bus other than the first, second, third, and fourth signal lines of the data bus.

8. The circuit arrangement of claim 7, wherein:
the first and second signal lines of the data bus are a first pair of signal lines;
the third and fourth signal lines of the data bus are a second pair of signal lines; and
the respective signal lines of the data bus are disposed between the first pair and the second pair of signal lines.

9. The circuit arrangement of claim 1, wherein:
each efuse cell in the bank of efuse cells has a sense amplifier,
the sense amplifier of each efuse cell of a first subset of the efuse cells is configured to output a signal having a logic-1 value in response to a default state of the efuse cell; and
the sense amplifier of each efuse cell of a second subset of the efuse cells is configured to output a signal having a logic-0 value in response to a default state of the efuse cell.

10. The circuit arrangement of claim 9, wherein:
an output of the first sense amplifier is coupled to a first signal line of a data bus, an output of the second sense amplifier is coupled to a second signal line of the data bus, and the first signal line of the data bus is adjacent to the second signal line of the data bus; and
the bank of efuse cells have outputs coupled to respective signal lines of the data bus other than the first and second signal lines of the data bus.

11. A method comprising:
providing a first sense signal by a first sense amplifier in response to an input of the first sense amplifier that is coupled to a signal line configured to carry a signal representing a constant logic-1 value;
providing a second sense signal by a second sense amplifier in response to an input of the second sense amplifier that is coupled to a signal line configured to carry a signal representing a constant logic-0 value;
inputting to an efuse control circuit, signals from a bank of efuse cells, the first sense signal and the second sense signal;
storing data representative of values of the signals from the bank of efuse cells and values of the first sense signal and second sense signal in a storage circuit;
reading the data from the storage circuit by an efuse security circuit, and
generating by the efuse security circuit, an alert signal having a state that indicates a security violation in response to data representative of the value of the first sense signal indicating a logic-0 value or data representative of the value of the second sense signal indicating a logic-1 value.

12. The method of claim 11, further comprising:
carrying the first sense signal on a first signal line of a data bus; and
carrying the second sense signal on a second signal line of the data bus that is adjacent to the first signal line of the data bus.

13. The method of claim 12, further comprising carrying signals from the bank of efuse cells on respective signal lines of the data bus other than the first and second signal lines of the data bus.

14. The method of claim 11, further comprising:
providing a third sense signal by a third sense amplifier in response to an input of the third sense amplifier that is coupled to the signal line configured to carry the signal representing a constant logic-1 value;
providing a fourth sense signal by a fourth sense amplifier in response to an input of the fourth sense amplifier that is coupled to the signal line configured to carry the signal representing a constant logic-0 value; and
inputting the third sense signal and the fourth sense signal to the efuse control circuit.

15. The method of claim 14, further comprising generating by the efuse security circuit, the alert signal having the state that indicates a security violation in response to data representative of the value of the signal from the third sense amplifier indicating a logic-0 value or data representative of the value of the signal from the fourth sense amplifier indicating a logic-1 value.

16. The method of claim 15, further comprising:
carrying the first sense signal on a first signal line of a data bus;
carrying the second sense signal on a second signal line of the data bus that is adjacent to the first signal line of the data bus;
carrying the third sense signal on a third signal line of a data bus; and
carrying the fourth sense signal on a fourth signal line of the data bus that is adjacent to the third signal line of the data bus.

17. The method of claim 16, further comprising carrying signals from the bank of efuse cells on respective signal lines of the data bus other than the first, second, third, and fourth signal lines of the data bus.

18. The method of claim 17, wherein:
the first and second signal lines of the data bus are a first pair of signal lines;
the third and fourth signal lines of the data bus are a second pair of signal lines; and
the carrying the signals from the bank of efuse cells on the respective signal lines of the data bus includes carrying the signals from the bank of efuse cells on the respective signal lines of the data bus that are disposed between the first pair and the second pair of signal lines.

19. The method of claim 11, wherein each efuse cell in the bank of efuse cells has a sense amplifier, and the method further comprising:
outputting by the sense amplifier of each efuse cell of a first subset of the efuse cells, a signal having a logic-1 value in response to a default state of the efuse cell; and
outputting by the sense amplifier of each efuse cell of a second subset of the efuse cells, a signal having a logic-0 value in response to a default state of the efuse cell.

20. The method of claim 19, further comprising:
carrying the first sense signal on a first signal line of a data bus;
carrying the second sense signal on a second signal line of the data bus that is adjacent to the first signal line of the data bus; and
carrying signals from the bank of efuse cells on respective signal lines of the data bus other than the first and second signal lines of the data bus.

* * * * *